United States Patent [19]

Macovski

[11] Patent Number: 4,577,152
[45] Date of Patent: Mar. 18, 1986

[54] SELECTIVE MATERIAL PROJECTION IMAGING SYSTEM USING NUCLEAR MAGNETIC RESONANCE

[76] Inventor: Albert Macovski, 2505 Alpine Way, Menlo Park, Calif. 94025

[21] Appl. No.: 483,827

[22] Filed: Apr. 11, 1983

[51] Int. Cl.⁴ .............................................. G01R 33/20
[52] U.S. Cl. .................................... 324/309; 324/313
[58] Field of Search ............... 324/300, 307, 309, 312, 324/313

[56] References Cited

U.S. PATENT DOCUMENTS 3,052,834  9/1962  Schuster .............................. 324/313
4,115,730  9/1978  Mansfield ............................. 324/312
4,300,096  11/1981  Harrison ............................. 324/309

Primary Examiner—Michael J. Tokar
Attorney, Agent, or Firm—Flehr, Hohbach, Test, Albritton & Herbert

[57] ABSTRACT

Two-dimensional projection measurements are formed of the NMR activity within a volume. Measurements are made using different intensities of the main magnetic field, using the different dependencies of relaxation times on magnetic field. The projection measurements are combined to obtain projection images of specific materials within the volume. Projection images are obtained of specific regions within the volume by insuring that the unwanted regions remain insensitized. For improved SNR, projection measurements are repeated to obtain spin-echo signals. The measurements of relaxation times are interleaved so that the data acquisition can occur rapidly.

37 Claims, 7 Drawing Figures

SELECTIVE MATERIAL PROJECTION IMAGING SYSTEM USING NUCLEAR MAGNETIC RESONANCE

BACKGROUND OF THE INVENTION

1. Field of the Invention

This invention relates to medical imaging systems using nuclear magnetic resonance. In a primary application the invention relates to projection imaging of specific materials having unique NMR properties.

2. Description of Prior Art

Nuclear magnetic resonance, abbreviated NMR, represents a new approach to medical imaging. It is completely non-invasive and does not involve ionizing radiation. In very general terms, magnetic moments are excited at specific spin frequencies which are proportional to the local magnetic field. The radio frequency signals resulting from the decay of these spins are received using pick-up coils. By manipulating the magnetic fields, an array of signals are provided representing different regions of the volume. These are combined to produce a volumetric image of the density of the body.

A descriptive series of papers on NMR appeared in the June 1980 issue of the IEEE Transactions on Nuclear Science, Vol. NS-27, pp. 1220-1255. The basic concepts are described in the lead article, "Introduction to the Principles of NMR" by W. V. House, pp. 1220-1226.

A number of three-dimensional methods are described. One important one is described by P. V. Lauterbur and C. M. Lou entitled, "Zeugmatography by Reconstruction from Projections," pp. 1227-1231. In this approach, a linear field gradient is superimposed on the strong axial magnetic field. As a result of the gradient, each plane in the volume, in a direction normal to the gradient, experiences a different resonant frequency. A burst, containing a spectrum of frequencies, is used to simultaneously excite each of the planes. The received signal, following the excitation, is then Fourier transformed into its individual components. The amplitude at each frequency represents a planar integration of the proton density. This process can be repeated using a gradient field in different directions to collect information about arrays of planes. These planar integrals can be used to produce two-dimensional projection images of a volume or, alternatively, three-dimensional information about the proton density of each voxel in the volume.

The projection image is obtained by obtaining the integrated density of substantially all planes which are normal to the plane of the projection image. The total number of planes required, at all angles and positions, is substantially equal to the number of pixels in the two-dimensional projection image. The reconstruction procedure involves the classical reconstruction from projections widely used in current computerized tomography systems. The most generally used procedure is that of convolution-back projection.

The resultant two-dimensional projection images have a number of drawbacks and, as a result, are not used. Firstly, the superimposed intervening structures make it very difficult to visualize the desired structure, be it an organ or tumor. Secondly, the nature of this imaging procedure is such that all of the measurements affect every reconstructed pixel. This makes the image particularly sensitive to motion. Any motion of the object will cause artifacts in the image due to inconsistencies where the object does not match its projections. These artifacts can often obscure the desired information.

To avoid the problems of intervening structures, three-dimensional reconstructions are made which provides cross-sectional images. The approach taken in the Lauterbur paper involves making an array of two-dimensional projection images at every angle through the object. Lines in these projection images represent line integrals or projections of cross-sectional planes of the object. Thus, again using classical reconstruction techniques, any desired cross-sectional plane can be reconstructed. The intermediate two-dimensional projections are not used for the reasons discussed.

Although these cross-sectional images are free of intervening structures, they are unsuitable for many medical problems. The cross-sectional format is often difficult to interpret. In addition, the acquisition of three-dimensional data takes a relatively long time, thus resulting in a variety of artifacts due to the various physiological motions of the body.

A second general method of acquiring and processing NMR imaging data is described in a paper by E. R. Andrew entitled "Nuclear Magnetic Resonance Imaging: The Multiple Sensitive Point Method" pp. 1232 to 1238 of the same issue. In this method, a selective system is used which acquires data from individual voxels in the volume of interest. This is accomplished using dynamically varying fields for the gradients. In general, with these dynamic fields, all but the small region not containing the time-varying field integrates to zero. Thus, if time varying fields of different frequencies are applied to three orthogonal axes, only a single point or voxel will not be time-varying. The signal will therefore represent solely that point without requiring reconstruction from projections.

The difficulty with this system is that it requires a very long data acquisition time since the signal is taken from one voxel at a time. Sufficient time must be spent at each voxel to provide an adequate signal to noise ratio. This problem is alleviated by using dynamic gradients on two axes and a static gradient on the third axis. Thus, in the direction of the third axis, each position again corresponds to a different frequency. Using wideband excitation and Fourier transforming the received signal the frequency spectra simultaneously provide the density of an array of voxels along a line. The line is that corresponding to the intersection of the two orthogonal dynamic gradients where all but a single line averages to zero.

Although this method avoids the motion artifacts caused by reconstruction from projections, it continues to provide a relatively long data acquisition time with the resulting blurring from physiological motions including respiratory and cardiovascular. In addition it is a three-dimensional imaging system which provides cross-sectional images.

A third imaging method is also line or point selective and is described in a paper by L. E. Crooks entitled, "Selective Irradiation Line Scan Techniques for NMR Imaging" of pp. 1239-1244 of the same issue. This general approach has a number of variations. In one, a selective pulse is used to excite a single plane of interest using a static gradient and an appropriately shaped pulse. The resulting signal from the excited plane is stored. Following equilibrium an orthogonal plane is excited with a higher intensity such that the magnetization is inverted or made negative. Irradiation of this type produces no received signal. The first step is then repeated by selectively exciting the plane of interest and storing the resultant signal. In this case, however, a line in the plane of interest will be missing since it has been saturated by the high intensity excitation of a plane orthogonal to the plane of interest. Thus the line of intersection is not included in the resultant signal. A simple subtraction of the first and second stored signals represents the line of intersection. By measuring different lines at many angles and positions in the plane of interest, using this subtraction procedure, a reconstructed image of the plane is made using classical reconstruction from projection techniques.

An alternative approach using the same line intersection of orthogonal planes avoids the subtraction operation. In this case the orthogonal plane is immediately excited with inverting radiation. The line of intersection is affected so as to produce a spin echo signal at a later time. Thus, at this later time, the signal represents the desired line only. Again, an array of line integral signals are used to provide a cross-sectional image.

Similar sensitive point and sensitive line methods have been suggested which results in saturation of all but a specific plane of interest. This is immediately followed by a similar excitation in an orthogonal direction which saturates everything in the plane except a line. Either the line integral signal can be acquired, or a third orthogonal excitation can be used to acquire the signal from a point or voxel. Saturation is achieved by a relatively long "burn" radio frequency pulse, in the presence of a gradient, which demagnetizes the region corresponding to the frequencies excited. This procedure is described in a paper by A. N. Garroway, P. K. Grannell and P. Mansfield, "Image Formation in NMR by a Selective Irradiative Process," which appeared in J. Phys. C: Solid State Physics, Vol. 7, 1974, pp. L457–L462.

An additional approach to NMR imaging is described in a recent book entitled Nuclear Magnetic Resonance Imaging In Medicine, published in 1981 by Igaku-Shoin, Ltd., Tokyo. Chapter 3 of this book, by Lawrence E. Crooks, provides an overview of the various imaging techniques. In addition to those already mentioned there is another planar integration approach described on pp. 44–47. Here, each plane integral is phase encoded by applying a gradient normal to the plane. When the gradient is removed, the nuclei along the plane have cyclical phase distributions, depending on the strength of the magnetic field. By acquiring these planar integrals using phase distributions with different spatial frequencies, information is acquired about each line in the plane. This information is decoded again using Fourier transforms. This approach has been termed spin warp imaging.

Each of the data acquisition systems described can be used to measure density, the longitudinal relaxation time $T_1$ and the spin-spin relaxation time $T_2$. As described in the previously referenced book, Nuclear Magnetic Resonance Imaging in Medicine, the density information can be acquired using an excitation which rotates the magnetic moment by 90°, and measuring the free induction decay or FID signal. $T_1$ can be measured by inverting the magnetic moment with a 180° excitation, and the following it with a 90° excitation whereby the resultant signal will be determined by the amount of decay. Alternatively, two 90° excitations, separated by a time less than $4T_1$, will result in signals whose amplitude differences can be used to determine $T_1$. The decay time of the FID signal cannot directly be used to measure $T_2$ since the inhomogeneity of the fields cause a rapid decay. However, if 180° inversion excitations are periodically applied, these serve to cancel the effects of the field inhomogeneity. If the amplitudes of the spin echoes following these inversion excitations are observed and compared to the initial FID signal following the 90° excitation, the decay is indicative of $T_2$. A variety of equivalent methods have been described for the measuring of the components. Cross-sectional images have been made of each of these components.

This same book, Nuclear Magnetic Resonance Imaging in Medicine, describes an alternate system of radio frequency excitation which has the advantage of being relatively noncritical as to the uniformity of the radio frequency excitation field. This is known as "adiabatic fast passage" or AFP. Here the frequency of the excitation signal is swept through resonance to provide a 180° inversion excitation, and swept over half that interval, to provide a 90° excitation. Its use is desirable where accurate excitations are needed without requiring a high degree of uniformity of the rf field.

Thusfar images have been made essentially of hydrogen, with its single proton nucleus. Other elements and isotopes have insufficient activity to produce cross-sectional images in a reasonable time. These elements have been studied, however, in non-imaging situations where the material content of a volume of interest is evaluated. It would be highly desirable, however, to provide images of other materials for a variety of applications including the study of metabolism.

An additional image sequence, which is used in some of the present commercial instruments, is described in a paper by I. R. Young, et al., entitled "Magnetic Resonance Properties of Hydrogen: Imaging of the Posterior Fossa," Amer. J. of Radiology, Vol. 137, pp. 895–901, November 1981. Here a single excitation burst is used to select the desired plane. This burst takes place in the presence of a z gradient, so that the burst frequency selects a specific xy plane in the volume. Immediately following the burst, when the FID signal is being received, the z gradient is turned off and a transverse gradient applied. This results in each line in the plane, normal to the transverse gradient, generating a different frequency. For cross-sectional imaging this sequence is repeated with the transverse gradient rotated to different angles so as to provide a complete set of projections. The reconstruction is accomplished by classical methods of reconstruction from projections, such as filtered back projection.

This application represents improved versions of the basic NMR selective projection imaging as described in U.S. Pat. No. 4,486,708 by the same inventor. In this application a unique system of projection NMR imaging is shown whereby projection measurements are made of a plurality of NMR components. There are then combined to obtain isolated projection images of specific materials. As to specifics, the U.S. Pat. No. 4,486,708 discusses the use of $\rho$, $T_1$, $T_2$, velocity, and the resonant frequencies of different materials. However, to cancel all of the undesired specific materials in the body and retain only a material of interest, a large number of independent NMR components are desired.

U.S. Pat. No. 4,486,708 also disclosed a unique approach to projection imaging whereby projections are obtained over a selected region of the volume. In one approach the non-selected regions are insensitized prior to making the sequence of projection measurements. However, during the time of making these measurements, some recovery of the non-selected regions can occur, making the region selectivity incomplete.

Although projection imaging has inherent basic advantages as far as signal-to-noise ratio, as discussed in U.S. Pat. No. 4,486,708 it does have the disadvantage that signals are received only once from each region. This factor tends to diminish the SNR relative to the imaging modalities.

Projection imaging of the density can take place relatively rapidly since each successive plane can be excited in sequence, with the resultant FID signal received. This is in contrast to cross-sectional imaging where the same planar section is repeatedly excited, with time allocated for relaxation between excitations, thus significantly increasing the acquisition time. When, however, projection images are obtained of signals sensitive to the relaxation times, as described in U.S. Pat. No. 4,486,708, each projection involves a time comparable to the relaxation time constant. Thus the acquisition time of this NMR component can be relatively long in projection imaging.

SUMMARY OF THE INVENTION

An object of this invention is to provide improved NMR projection images of specific materials in the body.

A further object of this invention is to provide selective NMR projection images of the body with substantially reduced data acquisition time.

A further object of this invention is to provide NMR projection images sensitive to relaxation time with substantially reduced data acquisition time.

A further object of this invention is to provide NMR projection images with improved signal-to-noise ratio.

A further object of this invention is to provide improved NMR projection images of specific portions of a volume.

Briefly, in accordance with the invention, two-dimensional projection images are formed representing different NMR components within the body. Additional projection measurements are obtained by using different magnetic fields, thus varying the relaxation time constants. These are processed to produce projection images of specific materials. The signal-to-noise ratio of the measurements is improved using repeated spin-echo signals. The data acquisition time of measurements of signals sensitive to relaxation times is significantly reduced by interleaving the excitations of each planar region. The projection imaging of a specific region is made more accurate by insensitizing the undesired regions between excitations.

BRIEF DESCRIPTION OF THE DRAWINGS

For a more complete disclosure of the invention, reference may be made to the following detailed description of several illustrative embodiments thereof which is given in conjunction with the accompanying drawings, of which.

DESCRIPTION OF THE PREFERRED EMBODIMENT

Figure 1:
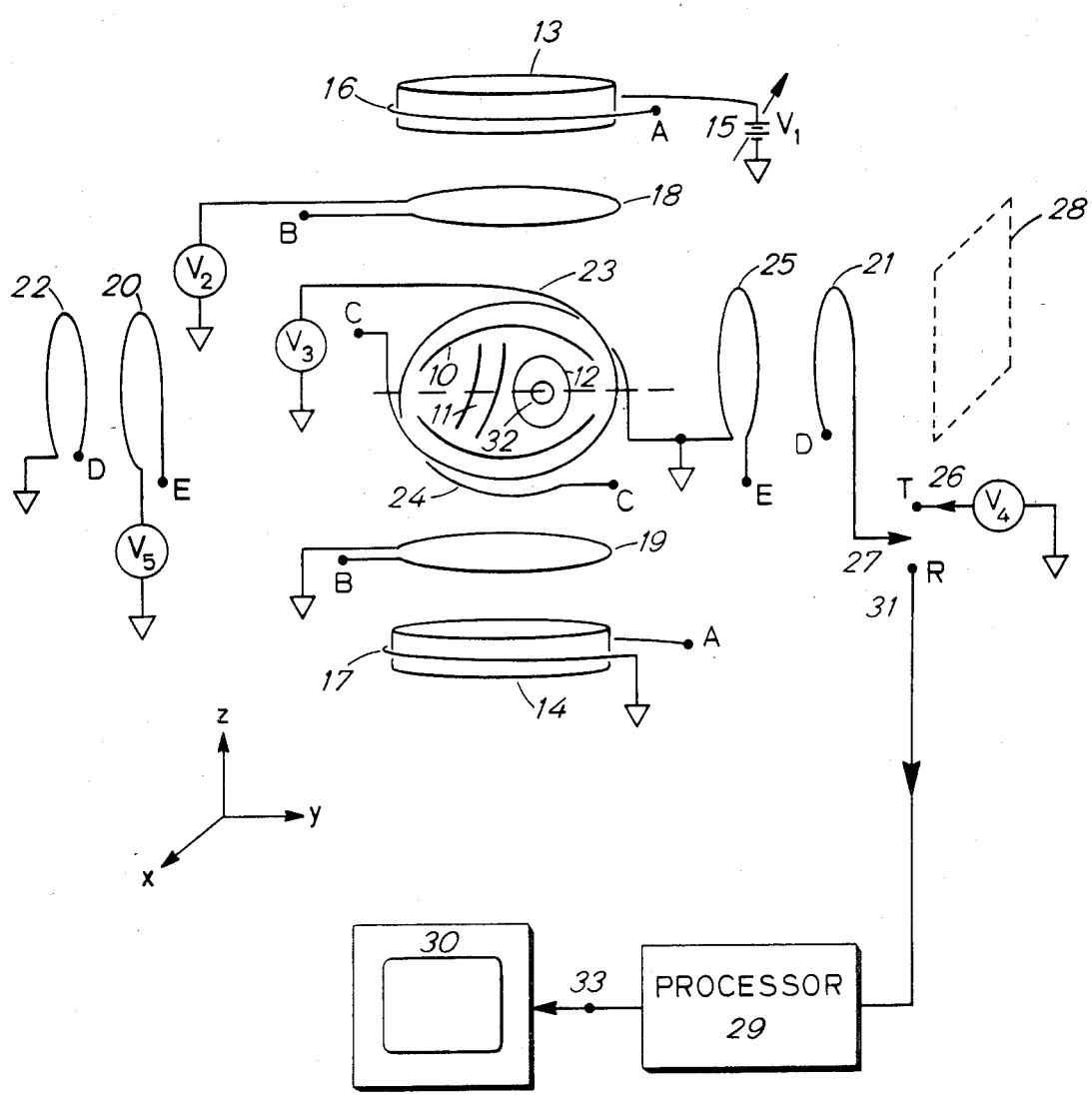
FIG. 1 is a schematic drawing illustrating an embodiment of the invention.

An understanding of the broad aspects of the invention may best be had by reference to FIG. 1. Here it is desired to selectively image specific features of the anatomy in volume 10 of the human body. For example, 11 can represent a bone structure which it is desired to visualize. Alternatively, bone structure 11 may be interfering with the visualization of soft tissue structure 12, which can represent the liver, kidneys, brain, etc. Also, it is often important to visualize regions of disease such as is illustrated by tumor 32 imbedded in soft tissue structure 12.

The methods employed in accomplishing these imaging tasks using NMR have thusfar employed cross-sectional imaging. This format is used since it avoids the problem of intervening structures. However, these approaches have many limitations including relatively long data acquisition time, poor resolution, poor SNR and a limited field of view. Although these parameters can be traded off, such as obtaining better resolution or SNR at the expense of a longer data acquisition time, the overall performance remains marginal.

Many of these problems can be solved by obtaining projection rather than cross-sectional images. These have a field of view encompassing the entire volume of interest. Also, since many fewer measurements are fundamentally required, systems with much shorter acquisition times, higher resolution and improved SNR can be structured.

The fundamental problem with these systems, as with all projection imaging, is that of intervening material obscuring the region of interest. In this invention, however, we provide methods of selectivity removing undesired intervening structures so that projection images are obtained of solely the region of interest, with all of the associated advantages.

In general, the principal axial magnetic field is produced using, for example, pole pieces 13 and 14 excited by coils 16 and 17. These are driven by a variable d.c. source $V_1$ with the coils 16 and 17 producing fields in the same direction to create a substantially uniform field throughout the region of interest in volume 10. This is by far the strongest field in the system with a strength of the order of one kilogauss. With both this coil and the remaining coils, the letter pairs A–E are simply convenient ways of indicating connections.

Specific regions are selected using the gradient coils. Coils 18 and 19 form a gradient field in the z direction driven by source $V_2$. Similarly coils 23 and 24 are on opposite sides of object 10 and thus form a gradient field in the x direction driven by source $V_3$. Unlike coils 16 and 17 which create a uniform field, these gradient coils are bucking each other so as to produce a varying field in the respective direction. Although a y gradient is not required for projection imaging in the y direction, as will be subsequently shown, it is important for projection imaging of a limited region of volume 10. This y gradient is developed, as with the previous gradients, using coils 20 and 25 driven by $V_5$.

Coils 21 and 22 are the radio frequency coils serving both the transmitter and receiver function. They produce fields in the same direction to create a substantially uniform field in volume 10. When switch 27 is in the transmit position, 26, generator $V_4$, is used to excite the magnetic spins in volume 10. When switch 27 is connected to the receive position, signal 31 is received from magnetic spin signals in volume 10. These are processed in processor 29 to provide a projection image of specific materials in volume 11. The resultant projection image is displayed in display 30. This is a projection of volume 10 onto plane 28.

Although a single rf coil system, 21 and 22, is shown for both transmit on receive, many instruments, for convenience, use separate transmit and receive coils to minimize the coupling, following the transmitter burst. In those cases clearly the transmitter coils would be permanently connected to terminal 26 and driven by $V_4$ while the receiver coils would by permanently connected to 31, feeding signal processor 29. In systems using separate sets of coils it is often useful to have their respective axes in quadrature, to minimize coupling, with both axes perpendicular to the z axes. Thus, if a separate set of receiver coils are added, they would be parallel to gradient coils 23 and 24.

A variety of combinations of excitation signals $V_4$ gradient signals $V_2$, $V_3$ and $V_5$, and processing systems 29 can be used to isolate specific materials, organs or lesions in volume 10. The projections of these isolated structures, projected onto plane 28, are displayed in display 30.

Using specific excitations, projections of the volume are obtained which are functions of $\sigma$, $T_1$, and $T_2$, which are respectively the spin density, the spin-lattice or longitudinal relaxation time and the spin-spin or transverse relaxation time. Each material has a unique set of these three parameters at a given field strength. We can make a sequence of measurements, each of which represents the projection of one or more of these materials. Functionally, these can be described as $f_n(\rho, T_1, T_2)$ where $f_n$ is some function of one or more of these parameters. In general, a number of measurement techniques are used to provide different functional relationships $f_n$ of the parameters. These can then be combined to, for example, eliminate any material k which has a given set $\rho_k$, $T_{1k}$ and $T_{2k}$. Similarly, they can be combined to enhance and/or isolate any material which has a given set of these parameters. This capability allows projection imaging to be used to its fullest advantage; by isolating the region of interest and removing intervening structures.

As an example, assume there are two materials in the projection path in volume 10, material A and material B. Using a projection imaging system, we excite the volume with an excitation which rotates the magnetic moment by the classical 90° flip angle. The resultant projection along the y axis of the free induction decay signal received is given by $$I_1 = \int \rho dy = \rho_a Z_a + \rho_b Z_b,$$

where $\rho_a$ and $\rho_b$ are the densities of the two materials and $Z_a$ and $Z_b$ are the path lengths in the y direction. Thus $Z_a$ and $Z_b$ are functions of x and z. Our desired isolated projection images are $Z_a(x,z)$ and $Z_b(x,z)$ since they represent the projections of specific materials. As the first step in isolating these projection images we store the projected measurement $I_1(x,z)$ in processor 29.

We then make a second measurement which includes a function of $T_1$. This can be accomplished by first exciting the volume with a 180° inversion excitation. This produces no FID signal. Then, after a time $t_a$, a 90° excitation is applied. The intensity of the received signal is given by $$I_2 = \int \rho[1 - 2e^{-t_a/T_1}]dy = \rho_a[1 - 2e^{-t_a/T_{1a}}]Z_a + \rho_b[1 - 2e^{-t_a/T_{1b}}]Z_b.$$

We thus have two equations representing the measured values $I_1(x,z)$ and $I_2(x,z)$ in terms of the two unknowns $Z_a(x,z)$ and $Z_b(x,z)$. The constants $\rho_a$, $\rho_b$, $T_{1a}$ and $T_{1b}$ are known for the materials of interest such as bone, soft tissue, etc. Solving these equations, we have $$Z_a(x,y) = \frac{I_2 - I_1 G_b}{\rho_a[G_a - G_b]}$$

where $$G_i = [1 - 2e^{-t_a/T_{1i}}].$$

Thus a separate isolated image is formed of the two-dimensional projection of material A. Similarly the $Z_b$ image is given by $$Z_b(x,y) = \frac{I_1 - \rho_a Z_a}{\rho_b}.$$

Once the $Z_a$ and $Z_b$ images are isolated, they can be used to cancel specific materials which are mixtures of these two components. For example, assume a lesion or organ material has a ratio r of $Z_a$ to $Z_b$. Then an image with this lesion cancelled $Z_l$ can be provided as given by $$Z_l = Z_a - rZ_b.$$

In addition to cancelling some specific material, this approach can also be used for evaluating an unknown material, such as in determining whether a tumor is benign or malignant. A control can be placed on the ratio r. While observing the display, the clinician can vary this control until the lesion disappears. The resultant ratio r is indicative of the material properties of the tumor.

We have thusfar dealt with signals representing two material properties, $\rho$ and $T_1$. The transverse or spin-spin relaxation time $T_2$ is measured by first using a 90° excitation or flip angle for $V_4$ providing a free induction decay. The intensity of this signal is the previously indicated $I_1$. After a time $t_b$, a 180° inversion is applied. This causes those signal phases caused by nonuniform magnetic fields to reverse and begin to move in phase, producing a spin echo signal at $2t_b$. The intensity of this signal $I_3$ is given by $$I_3 = \int \rho e^{-2t_b/T_2} dy = \rho_a e^{-2t_i/T_{2g}} Z_a + \rho_b e^{-2t_i/T_{2i}} Z_b = \rho_a H_a Z_a + \rho_b H_b Z_b,$$

where $$H_i = \exp[-2t_b/T_{2i}].$$

This additional piece of information can also be used to obtain isolated images of $Z_a(x,y)$ and $Z_b(x,y)$. More important, it can be used to isolate a third material $Z_c$. For example, the three measurements $I_1$, $I_2$, and $I_3$ can be used to make isolated projection images of the bone 11, soft tissue organ 12 and tumor 32 in volume 10.

Using matrix notation, the vector of intensity measurements is described by $$\bar{I} = \bar{M}\bar{Z}$$

where I is the measurement vector, $$\begin{bmatrix} I_1 \\ I_2 \\ I_3 \end{bmatrix}$$

$\bar{M}$ is the measurement matrix, $$\begin{bmatrix} \rho_a & \rho_b & \rho_c \\ \rho_a G_a & \rho_b G_b & \rho_c G_c \\ \rho_a H_a & \rho_b H_b & \rho_c H_c \end{bmatrix}$$

and $\bar{Z}$ is the material vector $$\begin{bmatrix} Z_a \\ Z_b \\ Z_c \end{bmatrix}$$

The solution to the three isolated material images is simply $$\bar{Z} = \bar{M}^{-1}\bar{I}$$

where $\bar{M}^{-1}$ is the inverse of matrix $\bar{M}$, the solution to the three simultaneous equations.

Figure 1A:
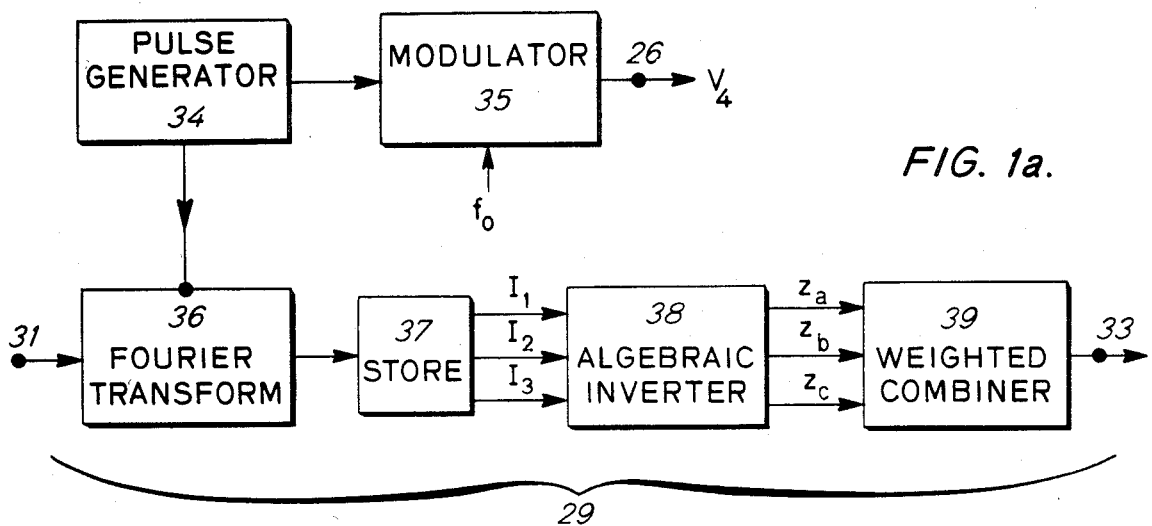
FIG. 1A is a block diagram illustrating an embodiment of the invention.

A representative processing operation 29 is shown in FIG. 1A. In many of the preferred projection imaging embodiments illustrated in this application, the received signal includes a spectrum of frequency components representing different line integrals or projections of different regions. To form the individual projection signals, received signal 31, be it an FID or spin echo, is subjected to a frequency decomposition in Fourier transform structure 36. These projection signals are then stored in storage structure 37 which performs many storage functions. Projections of different regions of the volume 10, such as different planar sections, are stored to form a projection of the entire volume. Also projections representing different NMR components including $\rho$, $T_1$, and $T_2$ are individually stored. Also, projections of the same components, repeated to improve the SNR, are combined and stored.

The individual stored projection measurements, $I_1$, $I_2$, $I_3$, etc., are then applied to algebraic inverter 38, as described, to isolate processed material signals $Z_a$, $Z_b$, $Z_c$, etc. These can then be directly displayed by each becoming signal 33, or can be combined in weighted combiner 39 to form any desired combination.

Pulse generator 34 acts as a master clock on the system. It drives modulator 35 which forms the various excitation signals $V_4$ from sinusoidal carrier frequency $f_0$. In addition it serves to gate the desired received signals 31 into Fourier transform structure 36, and reject the undesired received signals.

As can be seen, it is very important to have as large a measurement vector I as possible so as to eliminate the desired material in the presence of a large group of undesired materials. For example, it woul be highly desirable to provide a projection image of the abdomen and eliminate all materials other than malignant tumors, so that the selective projection image would immediately highlight solely these important lesions. However, the abdomen has a host of materials including liver, kidney, spleen, muscle, fat, etc. We have thusfar, as was shown in U.S. Pat. No. 4,486,708, only three basic parameters, $\rho$, $T_1$ and $T_2$. Since there are many cases where three independent measurements are not enough, further parameters would be highly desirable. U.S. Pat. No. 4,486,708 provides additional parameters through the resonances of elements other than hydrogen. However, although projection imaging is a great boon to the imaging of these elements, their low activity and abundance forces compromises in SNR and resolution.

Additional projection components can be obtained, in a unique approach by making use of the dependence of relaxation times on the main magnetic field. These relaxation times change in different ways for each material. This is illustrated in a review paper by P. A. Bottomley in the Rev. Sci. Instrum., Vol. 53, September 1982, pp. 1319-1337 entitled, "NMR Imaging Techniques and Applications: A Review." Here the $T_1$ values are studied with about a 10 to 1 increase in the main magnetic field. As is shown in Table 1 of the paper, some materials such as skeletal muscle, increase their $T_1$ values more than 3 to 1 while other materials, such as red marrow, remain relatively unchanged. This therefore provides another source of unique, material-dependent measurements. Each projection measurement of a relaxation-sensitive signal is repeated using a different magnetic field, thus increasing the dimensionality of the measurement vector I.

Figure 2:
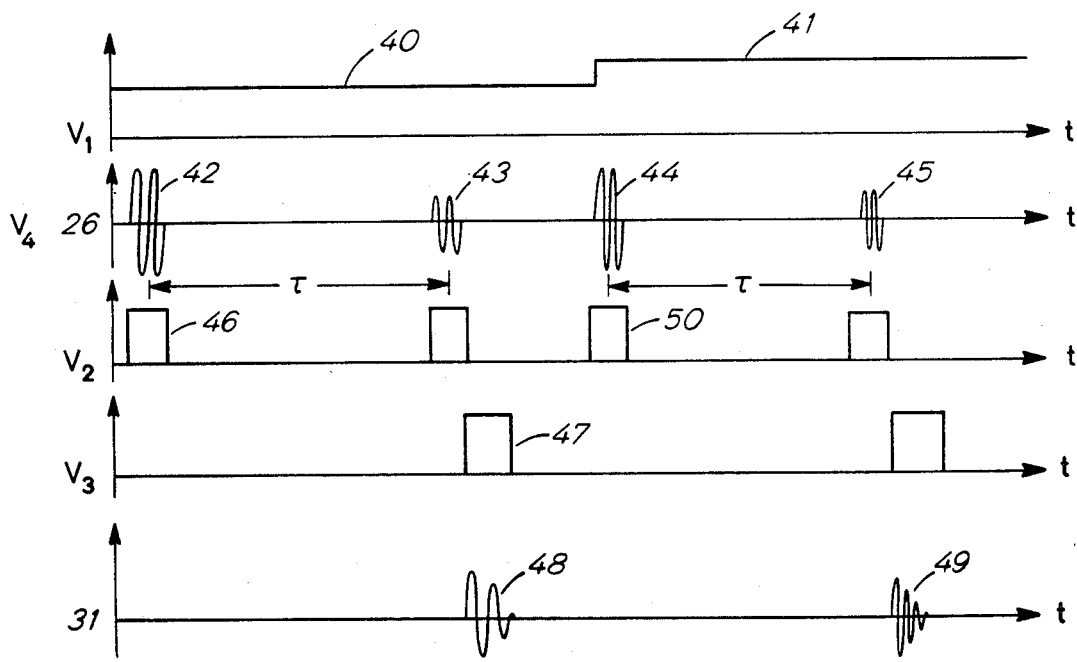
FIG. 2 is a set of waveforms illustrating an embodiment of the invention using different values of the main magnetic field.

A specific example is illustrated in FIG. 2. Here, using a first value of the main field driven by $V_1$, signal segment 40, the magnet is brought to a first magnetic field. In the presence of a z gradient, indicated by signal segment 46 in gradient signal $V_2$, the volume of interest is excited by placing switch 27 in the transmit position. An rf burst, signal segment 42, is used for $V_4$ to provide an inversion excitation at a particular xy plane, as determined by the burst frequency and the z gradient. The resultant magnetization decays, as given by $$M = M_0[1 - 2 \exp(-t/T_1)]$$

where M is the magnetization. The additional factor due to incomplete recovery of the magnetization from a previous excitation has been ignored, for convenience, since it has no substantial effect on the substance of the invention.

In order to provide a signal sensitive to $T_1$, a relaxation period $\tau$ is allowed, after which the system is excited by an rf burst to provide a 90° flip angle, signal segment 43. The same z gradient signal $V_2$ is used so that the same plane will be excited. Following this excitation the switch 27 is placed in the receive position with received signal segment 48 being an FID having an amplitude proportional to $$v = \int \rho [1-2\exp(-\tau/T_1)] dy$$

where $\rho$ and $T_1$ are functions of x and y and $T_1$ is additionally a function of frequency or main magnetic field. To provide the x distribution of the projection along the selected plane, x gradient $V_3$ is used, shown as signal segment 47. This provides a different frequency for each line integral along the selected plane. Processor 29 then includes a frequency decomposition system, such as a digital Fourier transform, to decompose FID 48 into an array of amplitudes of the different frequencies, each representing line integrals at different x values, or, projection points of projection image 28, along one line where y is some constant. This process can be repeated, using different frequencies for signals 42 and 43, corresponding to different xy planes, to complete the projection image. The resultant projection image would be sensitive to $\rho$ and $T_1$ at a particular frequency, as determined by $V_1$.

However, to achieve more degrees of freedom for greater material selectivity, at each plane the process is repeated using a different magnetic field, where $V_1$ is increased to value 41. This results in a new higher frequency range for inversion burst 44 and 90° burst 45, again separated by $\tau$. The z gradient $V_2$ is adjusted, shown as signal segment 50, so that the same plane is excited as at the lower magnetic field. The entire process is repeated to achieve spin echo signal 49, the FID at the higher magnetic field. This signal represents the projection of the same plane, except that the $T_1$ dependence for different materials will change, due to the different magnetic field. Complete projection image information then becomes available at both values of magnetic field. This is again used in the algebraic inversion process in processor 29 to extract images of more specific materials.

The example in FIG. 2 was for deriving signals and images sensitive to $T_1$. However, the same process can be done for $T_2$. Here $V_4$ signals 42 and 43 are replaced by the classic $T_2$ measurement. This involves an initial 90° burst followed by a time $\tau$ followed by a 180° inversion signal. These give rise to a spin echo signal whose amplitude is given by $$v = \rho e^{-2\tau/T_2}$$

with the spin echo occurring an additional time $\tau$ after the inversion excitation. The remainder of the system is exactly as previously described using FIGS. 1 and 2. Here again, measuring the relaxation-sensitive signals at different magnetic fields provides the additional information needed for more exact material selectivity.

The received signals in projection imaging have the advantage of being proportional to the projection length of the structure of interest. They have the disadvantage, however, of representing a single excitation of each region, thus reducing the SNR or signal-to-noise ratio. This can be enhanced through repeated measurements of the same region. Unfortunately, this can involve increased data acquisition time intervals if the nuclei must relax between excitations. Since $T_1$ is about 0.5 seconds in most tissue, this can appreciably lengthen the data acquisition time, with each line in the image requiring approximately an additional 0.5 second.

Figure 3:
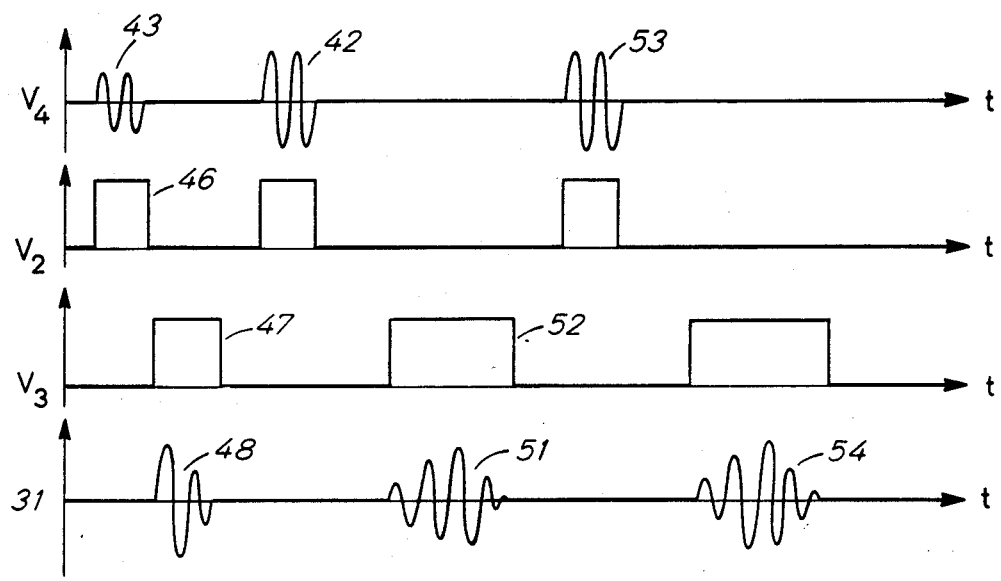
FIG. 3 is a set of waveforms illustrating an embodiment of the invention for obtaining improved SNR.

The SNR can be increased without a significant increase in data acquisition time using the system shown in FIG. 3. Here, as an example, simple projection imaging waveforms are illustrated for developing a projection imaging system of density. As in previous discussions, a plane is selected using z gadient signal $V_2$ with signal segment 46 to establish the gradient and rf excitation burst 43 as transmitter signal $V_4$. These serve to excite a specific xy plane at some value of z. This excitation is immediately followed by an FID signal 48 which is proportional to the projection of $\rho$. Gradient signal segment 47 of the x gradient signal $V_3$ served to decompose FID signal 48 into different frequencies, each representing different x values along the projection. Thus signal 48, when subjected to Fourier transformation using processor 29, represents all of the projection points of projection plane 28 along a particular z line. To complete projection image 28 the sequence is repeated changing the frequency of rf burst 43 to excite a different plane. The remainder of the operation is identical.

However, if enhanced SNR is desired, the system further shown in FIG. 3 is employed using repeated spin echoes. Repeated spin echoes, for different purposes, were described in a paper by Z. H. Cho, et al., "Fourier Transform Nuclear Magnetic Resonance Tomographic imaging," Proc. of the IEEE, Vol. 70, October, 1982, pp. 1152-1173. Here spin echoes are used for cross-sectional or three-dimensional imaging involving the rapid sequential acquisition of different projections of the same plane, or the simultaneous acquisition of many planes. In projection imaging, however, this approach represents a unique method of improving the SNR by rapidly acquiring near-identical data.

As shown in FIG. 3, following the initial FID signal 48 a 180° inversion burst 42 is used, with the same z gradient $V_2$, to rephase the spins in the same plane. This results in the classical spin echo signal 51 occurring in a time interval equal to that between the original 90° pulse 43 and the inversion pulse 42. The same x gradient as before, segment 52, is used in the presence of spin echo signal 51 so that it represents the same projection. Thus, when signal segment 51 is Fourier transformed in processor 29 it produces the same distribution as the transform of FID signal 48. These transforms, representing the projection of a plane, are added together in processor 29 to enhance the signal strength, hence the SNR. As shown in FIG. 3, the process can be repeated again, using inversion excitation 53 to provide spin echo 54 to further enhance the resultant projection signals resulting from combining all of the transformed projection signals corresponding to the same plane. The process can be repeated as long as the total time involved in the repetitive sequence remains small as compared to $T_2$, so that the successive spin echoes remain essentially unchanged in amplitude. This time can be minimized by having the inversion excitations, 42 and 53, occur as soon as possible after the decay of the previous received signals, 48 and 51.

In the example of FIG. 3, a signal sequence was used which results in received signals essentially proportional to the projection of the proton density. This same sequence can be used with any received signal, including those which follow relaxation intervals so as to develop signals sensitive to the relaxation times. The general procedure for the repeating spin echo sequence is to follow the normal received signal by an inversion excitation, just as signal segment 42 follows FID 48, and then continue as shown in FIG. 3. For example, in a $T_1$ sensitive inversion recovery system, an inversion excitation is followed by a relaxation interval after which a 90° burst produces an FID which is sensitive to $T_1$. Here the inversion excitation 42 of FIG. 3 would follow the FID, with the subsequent process as shown. For a $T_2$ sensitive system a 90° burst is followed by a relaxation interval after which an inversion excitation is used to produce a spin echo signal after a similar relaxation interval. Here the inversion excitation 42 of FIG. 3 would follow the spin echo signal, with the subsequent process following as shown to provide the desired SNR improvement. This same approach can be applied to the system shown in FIG. 2 where different main magnetic fields are used to alter the relative relaxation times. Again, following spin echoes 48 and 49 of FIG. 2, corresponding to two values of the main field, inversion excitation 42 of FIG. 3 is used with the subsequent processes as shown. This system for SNR improvement can also be applied to the system for providing projection images of blood vessels described in U.S. Pat. No. 4,486,708 by the same inventor. Here projection images are obtained of moving materials. For some vessels, SNR enhancement through repeated spin echoes is significant.

One of the valuable attributes of projection imaging is its potential for rapid data acquisition, thus avoiding the effects of motion. This is made possible in projection imaging since, in some embodiments, as the planar sections of the volume are excited in sequence, no relaxation times are involved. Following the excitation of a plane, the next one can be immediately excited, since its equilibrium has not been disturbed by the first excitation. This is in contrast to cross-sectional imaging systems where each excitation is of the same planar section, so that a relaxation interval is used, following each excitation, to restore the magnetization.

In a projection system measuring density the rapid data acquisition is accomplished in a sequential manner. Each planar section is excited, the density-dependent FID is received, and immediately the next planar section is excited. However, when making projection images sensitive to relaxation times, the situation is quite different. If, for example, the entire signal sequence from excitation through the relaxation interval to the received signal is done in sequence for each planar section, the data acquisition time will be inordinately long. Significant reduction in data acquisition time can be achieved, however, by the method illustrated in FIG. 4.

Figure 4:
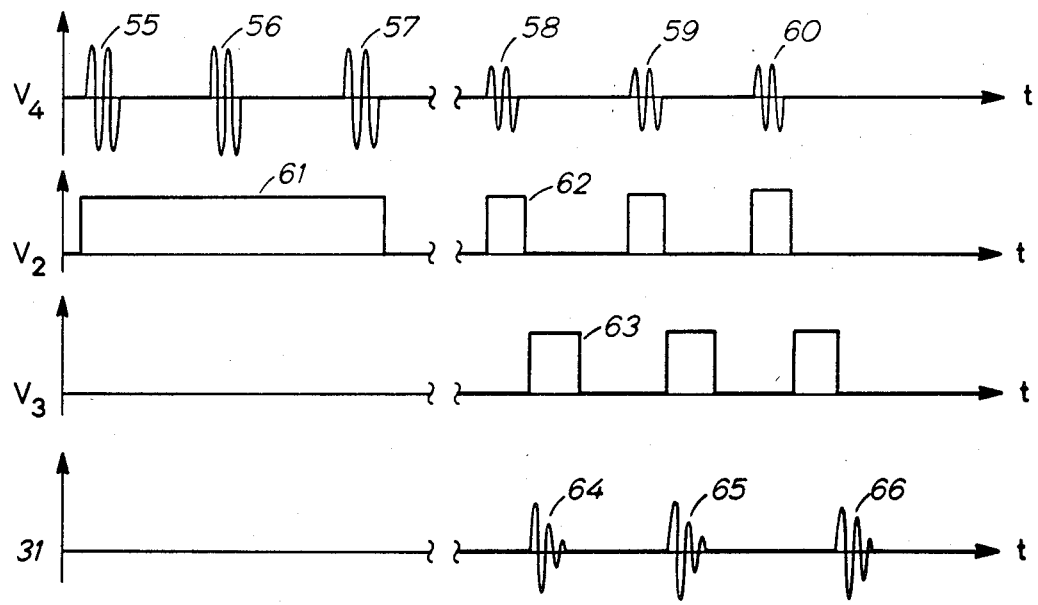
FIGS. 4 and 5 are sets of waveforms illustrating embodiments of the invention for obtaining rapid projection measurements sensitive to relaxation times.

FIG. 4, for purposes of illustration, uses an inversion recovery system for developing a projection image sensitive to $T_1$. This data, along with others, are then used in an algebraic inversion system to isolate specific materials. As shown, the inversion recovery sequence is interleaved so as to drastically reduce the data acquisition time. At first, the inversion excitation is applied, in sequence, to an array of planar sections, without waiting for a signal to be received. This is shown in FIG. 4 for three sections as an illustrative example. Inversion excitations 55, 56 and 57 are sequentially applied, in the presence of z gradient signal $V_2$ shown as signal segment 61. Each of these excitations are at a different frequency, thus exciting a different planar section. Following an appropriate relaxation period shown as a break in the waveforms, usually a time period comparable to $T_1$, each planar section is interrogated by a burst providing a 90° flip angle. This is accomplished, as shown using rf bursts 58, 59 and 60, each having the same frequencies as inversion excitations 55, 56 and 57 respectively. In the presence of each of these burst excitations we apply z gradient signal $V_2$, shown as segment 62, which has the same amplitude as segment 61 and is repeated for each 90° burst. This insures that the 90° bursts interrogate the same planar section as that of their corresponding inversion excitations.

Following each 90° burst we produce FID signals 64, 65, and 66 respectively for received signal 31. Each of these are received in the presence of x gradient signal $V_3$ shown as signal segment 63, which is identical for each FID. This x gradient, as before, provides each line integral at each x position with a different frequency. Processor 29 uses frequency decomposition on each of the FID signals to provide projection signals for each excited plane. These projection signals, sensitive to $T_1$, can be applied directly to display 30 or, can be combined with other measurements in an algebraic inversion system to apply selective material signals to display 30.

The system in FIG. 4 illustrated the interleaved method for $T_1$. A similar approach would be used for $T_2$. Here we first use a sequence of 90° bursts of different frequencies, in the presence of a z gradient, to initially excite each planar section. Following a first relaxation period a sequence of inversion excitations are used, of the same frequencies and with the same z gradient, to rephase the spins in each planar section. Following a similar second relaxation period, the sequence of spin echoes, representing each planar section, are received. These are received in the presence of an x gradient $V_3$ so as to provide the projection data for each plane of the $T_2$ sensitive signal.

In each of the previously described embodiments for providing $T_1$ and $T_2$ sensitive projection signals, the time sequence for each planar section was the same. Thus, as illustrated in FIG. 4, the time between inversion excitation 55 and 90° rf interrogation burst 58 is the same as between 56 and 59, and that between 57 and 60. Therefore, each planar section, corresponding to each line in the projection image, has the same relaxation sensitivity. Although this is desirable, it may not be required. Relatively small variations in time intervals for different planar sections can represent unimportant errors, and allow simpler embodiments. This is especially true in projection systems as compared to cross-sectional systems. In the latter, each measurement of the same section should be under similar conditions, otherwise artifacts occur due to inconsistency.

One example of this simplification can be achieved, referring to FIG. 4, by replacing the individual inversion excitations, 55, 56 and 57, in the presence of z gradient signal 61, with a single broadband inversion signal which excites the entire volume of interest. The remainder of the waveform sequence, beyond the break in the time axis, remains exactly as shown in FIG. 4. The price paid for this simplification is that each planar section, corresponding to each line in the projection image, will represent a slightly different function of $T_1$. The broadband excitation in the presence of a z gradient is one method of applying an inversion excitation to the entire volume. Other approaches include an adiabatic fast passage excitation, involving the sweeping of the frequency through resonance, or a single frequency excitation, both of these applied in the absence of a z gradient.

Figure 5:
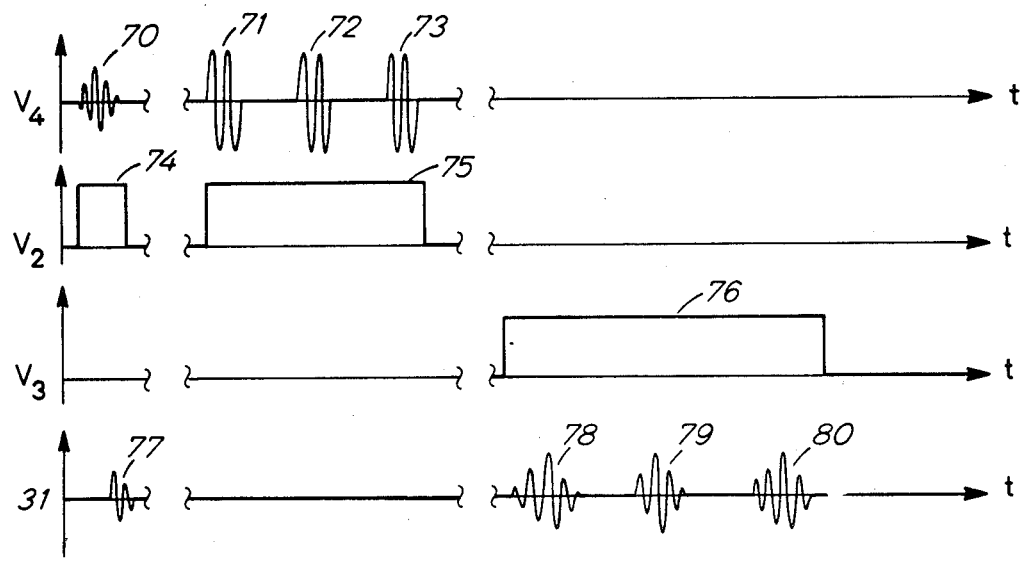

This same general approach of having one of the two excitations excite the entire volume can also be applied to $T_2$ sensitive imaging, as shown in FIG. 5. Here the entire volume is first excited with a 90° flip angle with wideband rf pulse 70 applied in the presence of z axis gradient signal segment 74. The resultant FID, signal 77, is ignored since it represents contributions from the entire volume. As previously indicated this excitation of the entire volume can also be achieved by a narrow band 90° burst without any gradient or a partial adiabatic fast passage signal. Following this first excitation we undergo the first relaxation period as indicated by the first break in the time axis. We next apply the second excitation, the inversion excitation, in sequence to the individual planar sections using inversion excitation 71, 72, and 73, all of different frequencies, in the presence of z gradient signal segment 75, to sequentially rephase the spins of the individual planar sections. After a similar delay period, these give rise, as shown, to three successive spin echo signals 78, 79, and 80 corresponding to the three inversion excitations. Since these are received in the presence of x gradient signal segment 76, they are decomposed in frequency to represent projections of each planar section. Therefore each spin echo signal is Fourier transformed, as in previous examples, in processor 29 where the signals are stored and combined with other stored signals to provide selective projection images in display 30.

Many variations of this basic theme can be used. For example, the first of the excitations can be applied individually to each planar section and the second applied simultaneously to the entire volume. In the example of FIG. 5 this would mean $V_4$ having three successive 90° burst excitations, each of a different frequency, to sequentially excite three planar sections. The inversion excitation, following the delay period, can then be made a single broadband burst to simultaneously rephase all of the spins in all planar sections. This would also be followed by three spin echoes, as shown in FIG. 5. Of course, as previously described in connection with FIG. 4, we can apply both excitations to individual planar sections with both the 90° and 180° inversion excitations consisting of three separate rf bursts, with each pair having the same time separation. This latter approach has the additional desirable characteristic of deriving information about $\rho$ and $T_1$ separately. The individual FID signals following the 90° bursts, which were ignored in the system of FIG. 5, can be used to evaluate $\rho$, while the resultant spin echo signals yield the $T_2$ sensitive signal of the general form $\rho \exp(-2\tau/T_2)$.

This general method of interleaving the excitations and received signals from different regions of the volume significantly reduces the data acquisition time. This same process can be used in conjunction with the previously described system of FIG. 2 where data is collected using different values of the main field. Here the entire sequence of FIGS. 4 and 5, or its variations, are repeated using one or more different values of $V_1$ to change the main field and the associated dependence on relaxation times. Similarly this method of interleaving can be applied to the system of FIG. 3 where the SNR is improved using repeated spin echoes. Following any of the received signals in FIGS. 4 and 5 an inversion excitation can be used to produce a spin echo signal which, when combined with the first signal, yields an enhanced projection signal and therefore an enhanced SNR.

U.S. Pat. No. 4,486,708 stressed the importance of being able to form projection images over portions of the volume. This can be very significant. Very often it is difficult or inconvenient to eliminate a given structure from the projection through material selectivity alone. For example, a large tumor in the posterior portion of the anatomy may be obscuring an anterior tumor in the same projection path. Since the materials are the same, they cannot be separated through material selectivity. In x-ray systems we are forced to use the entire projection since the x-ray photon must enter on one side of the body and leave on the other. In NMR, as disclosed in U.S. Pat. No. 4,486,708, we can make projections over part of the volume, thus eliminating the posterior tumor which obscures the anterior tumor. Thus, referring to FIG. 1, we could eliminate structure 11 although it is within the projection path, even if it were the same material as that of 12 or 32.

U.S. Pat. No. 4,486,708 referred to a concept described in a paper by A. N. Garroway, et al., "Image Formation in NMR by a Selective Irradiation Process," in Journal Phys. C.: Solid State Physics, Vol. 7, 1974. Here a saturation or "burn" excitation is used to initially demagnetize a portion of the volume. Following this excitation the projection image is obtained, thus not including this non-selected region of the volume.

One difficulty with this method is that, during the sequence of excitations used in creating the desired projection image, the demagnetized region partially recovers. This reduces the degree of selection in that the non-selected region will be partially imaged as a result of this recovered magnetization. This can be important in cases where the selected region is relatively small compared to the non-selected region, where almost complete rejection is required so as to adequately visualize the selected region.

Figure 6:
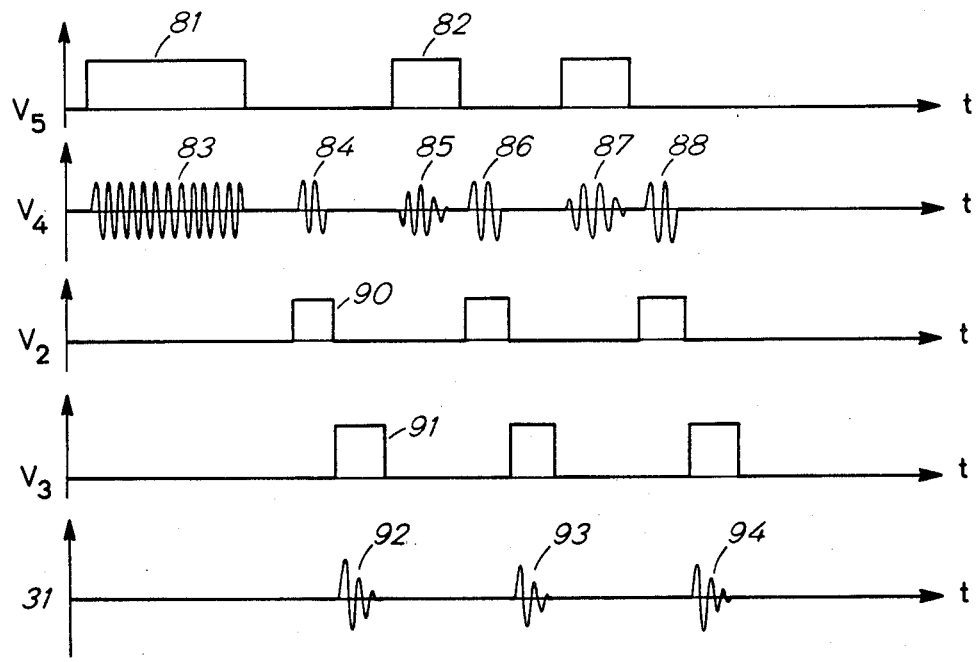
FIG. 6 is a set of waveforms illustrating an embodiment of the invention for selecting a region of the volume being imaged.

A unique approach to providing improved selection is shown in FIG. 6. Here, for illustrative purposes, a system is shown for obtaining projection images of density although it can be applied to any of the selective projection imaging methods disclosed thusfar. As disclosed in U.S. Pat. No. 4,486,708 a saturation or "burn" rf excitation, signal segment 83, is applied as $V_4$. This is an rf signal having a duration comparable to the spin lattice relaxation time $T_1$. It is applied in the presence of y gradient signal $V_5$, using signal segment 81. The frequency spectrum of this signal segment 83, in conjunction with gradient signal segment 81, is such as to represent those portions of the volume, in the projection direction, which are to be eliminated, or the non-selected regions. Because of gradient $V_5$, each y value corresponds to a different frequency, such that any y values of the volume can be eliminated by varying the spectral content of burst 83. Unfortunately, following burst 83, the non-selected saturated regions achieve partial recovery of their magnetization, thus diluting the selective effect.

Following the projection imaging approach, 90° burst 84 is applied in the presence of z gradient segment 90 to excite a planar section. The resultant FID 92 is received in the presence of x gradient segment 91 to provide the desired projection signal of that planar section, as has been previously shown. The projection signal derived from FID 92 will not contain information from those y regions in the volume which were demagnetized using 83. If this process were to continue, with additional planar sections excited, the non-selected y regions would slowly recover and appear in the processed projection image. To prevent this from happening the non-selected regions are further insensitized as shown using broadband 90° burst 85 in conjunction with y gradient segment 82. This y gradient segment has the same amplitude as that of 81, and burst 85 has the same spectrum as signal segment 83, thus renewing the insensitizing of the non-selected y regions by driving the magnetic moment into the xy plane.

Following this renewed insensitizing, burst 86, having a different frequency than 85 is applied in the presence of the same z gradient $V_2$ to excite another planar section. The resultant FID 93, in the presence of the same x gradient $V_3$, provides the projection of the selected regions of another planar section, with the non-selected regions not responding. Following FID 93 the non-selected y regions are again insensitized suing a wideband 90° burst 87, having the same spectrum and using the same y gradient signal $V_5$. Following this, burst 83, having a different frequency, selects another planar section resulting in FID 94 which again, contains solely the selected regions.

Many variations on this basic theme can be used. The initial rf signal 81 need not be a saturation or "burn" pulse. Its relatively long time interval does lengthen the total data acquisition time. Alternatively the same broadband 90° burst as in 85 and 87 can be used, to insensitize by rotating the magnetic moment 90°, rather than by saturation. However, although this reduces the acquisition time, it does force the rf field produced by rf coils 21 and 22 to be more critical in its uniformity to simultaneously and uniformly excite the entire volume. The saturation signal 83 is much less critical as to uniformity. Although the system of FIG. 6 illustrates an acquisition of density using FID signals, it can be used with any of the more complex sequences involving $T_1$ and $T_2$. In each case signal 83 is used to initially insensitize the non-selected region. Then, prior to each excitation signal used in projection measurements, a broadband 90° excitation is used in the presence of a y gradient to renew the insensitizing of the non-selected region.

If an unusually high degree of selection accuracy is desired, it can be considered that some recovery can take place between the 90° wideband bursts 85 and 87 and the excitation signals 86 and 88. This small recovery can be overcome by making these renewal bursts 85 and 87 have somewhat greater than a 90° flip angle so that, when the resultant magnetization decays slightly, it will be approximately zero at the time of the excitation of the selected regions. Since the exact decay rate is unknown, the system can be designed based on the average or anticipated relaxation time constant $\overline{T}_1$. The magnetization M, following the insensitizing excitations 85 and 87 is of the form $$M = M_0[1-(1-\cos\theta)e^{-t1/\overline{T}_1}]$$

where $\theta$ is the flip angle of the excitation and $t_1$ is the time following the excitation before the next excitation. We wish M to be zero at time $t_1$, for complete insensitization of the non-selected regions. Solving the equation for $\theta$ we obtain $$\theta = \cos^{-1}[1-e^{t1/\overline{T}_1}]$$

which for small values of $t_1/\overline{T}_1$ can be approximated as $$\theta \simeq \cos^{-1}(-t_1/\overline{T}_1)$$

which represents an angle slightly larger than 90°.

This system, as described, can be used to localize the projection of any desired cube in volume 10. The method described provided any desired localization in y. Since the projection 28 is in the xz plane, it can be masked to select any desired region in that plane, thus selecting any desired cube in the volume. It is interesting and highly useful to note that this unique selection system can also be used to effectively form a cross sectional image, in addition to a projection image. Here the spectrum of the excitation signal 83 is chosen so as to excite all but a thin planar section parallel to xy plane 28. Signal 83 would be of the form $$V_4 = [a \text{ sinc } at - b \text{ sinc } bt]\cos 2\pi f_0 t$$

where $f_0$ is the center frequency representing the desired planar section, a represents the width of the entire volume and b the width of the planar section. In the frequency domain, this becomes a broad spectrum, with a narrow central section which is zero, representing the desired planar section. This approach provides a rapid cross-sectional imaging system since each line in the section can be sequentially excited, without waiting for the usual relaxation intervals.

The system of FIG. 6 can be used with each of the previously described embodiments. It can be used with the embodiment of FIG. 2 where the measurements of the selected region of the volume are repeated, using different values of $V_1$ to change the main magnetic field, so that additional projection measurements can be taken of the selected region, allowing greater degrees of material selectively. As previously mentioned, although the illustrative system of FIG. 6 showed density measurements, it can also be used with the interleaved excitation system of FIGS. 4 and 6 to derive measurements of a selected region which are sensitive to $T_1$ and $T_2$. Basically the system is further insensitized, as shown in FIG. 6, preceeding each excitation of the selected region. Also, the improved SNR system of FIG. 3 can be combined with the selected region system of FIG. 6 by following the desired received signals by inversion excitations followed by spin echoes, to enhance each desired signal.

All of the unique data acquisition approaches shown have, for illustrative purposes, used the projection imaging method where a plane is selected using a z gradient, and then decomposed into integrals using transverse gradients. However, all of these data acquisition systems can equally well be used with any of the projection imaging systems described in U.S. Pat. No. 4,486,708 including the use of a.c. gradients, acquiring sets of planar integrals at different angles, intersection of perpendicular planes and spin warp. Also, any of the 3D reconstruction systems in the literature can be applied to projection imaging and use the data acquisition systems herein described.

What is claimed is:

1. In a method for producing selective material projection images of a volume using nuclear magnetic resonance the steps of:
   measuring the two-dimensional projection of a plurality of components of the nuclear magnetic resonance activity using different intensities of the main magnetic field; and
   processing these components to produce one or more two-dimensional projection images of specific materials of the volume.

2. The method as described in claim 1 wherein the step of measuring components includes the step of confining the measurements to a region of the volume.

3. The method as described in claim 1 including the step of re-exciting each measurement region one or more times using inversion excitations to obtain successive spin-echo signals.

4. In a method for making a projection image of selected regions of a volume using nuclear magnetic resonance the steps of
initially insensitizing non-selected regions of the volume;
forming a series of projection measurements of the selected regions of the volume;
further insensitizing the non-selected regions of the volume between each projection measurement; and
reconstructing the projection image of the selected regions of the volume using the series of projection measurements.

5. The method as described in claim 4 wherein the step of initially insensitizing non-selected regions of the volume includes the step of saturating the spins of the non-selected regions.

6. The method as described in claim 4 wherein the step of initially insensitizing non-selected regions of the volume includes the step of exciting the non-selected regions with a field which provides a flip angle of substantially 90°.

7. The method as described in claim 4 wherein the step of further insensitizing the non-selected regions of the volume between each projection measurement includes the step of exciting the non-selected regions with a field which provides a flip angle of substantially 90°.

8. The method as described in claim 4 wherein the step of further insensitizing the non-selected regions of the volume between each projection measurement includes the step of exciting the non-selected regions with a field which provides a flip angle of greater than 90° such that the non-selected region will not produce a signal when the projection measurements are made of the selected region.

9. In a method for producing a projection image of a volume using nuclear magnetic resonance the steps of:
measuring the projections of the volume;
repeating the projection measurements using inverting excitations to produce spin-echo signals;
combining the received signals derived from each set of corresponding projection measurements to produce enhanced projection measurements; and
processing the enhanced projection measurements to provide the projection image of the volume whereby the signal-to-noise ratio has been enhanced.

10. The method as described in claim 9 wherein the step of measuring the projections of the volume includes the step of measuring a plurality of components of the nuclear magnetic resonance activity and the step of processing the enhanced projection measurements includes the step of combining the measurements of different components to provide projection images of specific materials of the volume.

11. The method as described in claim 9 wherein the step of measuring projections of the volume includes the step of confining the measurements to a region of the volume.

12. In a method for making a projection image of a volume which is sensitive to the nuclear magnetic resonance relaxation time the steps of:
exciting a first planar section in the volume using two excitation signals;
receiving signals from the first excited planar section following a relaxation interval;
similarly exciting other planar sections in the volume parallel to the first planar section such that the first of the excitations occurs before the signals are received from the first planar section; and
processing the received signals to provide a projection image sensitive to the relaxation time.

13. The method as described in claim 12 including the step of combining the received signals with signals representing different components of the nuclear magnetic resonance activity and the step of processing the combined signals to provide projection images of specific materials of the volume.

14. The method as described in claim 12 wherein the step of receiving signals from the planar section of the volume includes the step of confining the measurements to a region of the volume.

15. The method as described in claim 12 including the step of providing repeated excitation of each planar section using inversion excitations to obtain spin-echo signals and where the step of processing includes the step of combining the signals from each planar section.

16. The method as described in claim 12 where the step of exciting the planar sections using two excitation signals includes the steps of exciting the entire volume simultaneously with one of the excitation signals and exciting each planar section sequentially with the other excitation signal.

17. The method as described in claim 12 where the step of exciting the planar sections using two excitation signals includes the step of exciting each planar section with two excitation signals which are separated by the same time interval.

18. Apparatus for providing selective material projection images of a volume using nuclear magnetic resonance comprising:
means for measuring the two-dimensional projection of components of the nuclear magnetic resonance activity using different intensities of the main magnetic field; and
means for processing these components to produce one or more two-dimensional projection images of specific materials in the volume.

19. Apparatus as described in claim 18 including means for restricting the projection measurements to a region of the volume.

20. Apparatus as described in claim 18 including means for providing repeated measurements using inversion excitations to obtain spin-echo signals and further including means for combining corresponding measurements.

21. Apparatus for making projection images of selected regions of a volume using nuclear magnetic resonance comprising:
means for initially insensitizing non-selected regions of the volume;
means for deriving a sequence of projection measurements of selected regions of the volume;
means for further insensitizing the non-selected regions of the volume between each projection measurement; and
means for processing the projection measurements to produce the projection image of selected regions of the volume.

22. Apparatus as recited in claim 21 wherein the means for initially insensitizing non-selected regions of the volume includes means for saturating the spins of the non-selected regions.

23. Apparatus as recited in claim 21 wherein the means for initially insensitizing non-selected regions of the volume includes means for exciting the non-selected regions with an rf field which provides a flip angle of substantially 90°.

24. Apparatus as described in claim 21 wherein the means for further insensitizing the non-selected regions of the volume between projection measurements includes means for exciting the non-selected regions with an rf field which provides a flip angle of substantially 90°.

25. Apparatus as described in claim 21 wherein the means for further insensitizing the non-selected regions of the volume between projection measurements includes means for exciting the non-selected region with an rf field to provide a flip angle sufficiently greater than 90° such that the non-selected region will not produce a signal during the subsequent measuring interval.

26. Apparatus as recited in claim 21 wherein the selected region of the volume is a planar section and the non-selected region is the entire volume except for the planar section and the projection direction is normal to the planar section whereby the projection image is a cross-sectional image.

27. Apparatus for producing a projection image of a volume using nuclear magnetic resonance comprising:
means for making projection measurements of the volume;
means for repeating projection measurements using inversion excitations to produce spin-echo signals;
means for combining the signals from corresponding projection measurements to produce enhanced projection measurements; and
means for processing the enhanced projection measurements to produce a projection image of the volume.

28. Apparatus as described in claim 27 wherein the means for making projection measurements include means for measuring a plurality of components of the nuclear magnetic resonance activity and the means for processing the enhanced projection measurements includes means for combining the measurements of the different components to provide projection images of specific materials of the volume.

29. Apparatus as described in claim 27 wherein the means for making projection measurements include means for confining the measurements to a selected region of the volume.

30. Apparatus for producing a projection image of a volume which is sensitive to the nuclear magnetic relaxation time comprising:
means for exciting a first planar section of the volume using two excitation signals;
means for receiving signals from the first excited planar section following a relaxation interval;
means for similarly exciting other planar sections in the volume parallel to the first planar section such that the first of the excitations occurs before signals are received from the first section; and
means for processing the received signals to provide a projection image sensitive to the relaxation time.

31. Apparatus as recited in claim 30 including means for combining the received signals with other signals representing different components of the nuclear magnetic resonance activity and means for processing these to provide projection images of specific materials of the volume.

32. Apparatus as described in claim 30 wherein the means for receiving signals from the planar section includes means for confining the measurements to a region of the volume.

33. Apparatus as recited in claim 30 including means for providing repeated excitation of each planar section using inversion excitations to obtain spin-echo signals and the processing means includes means for combining the signals from each planar section.

34. Apparatus as recited in claim 30 wherein the means for exciting the planar sections using two excitation signals includes means for exciting the entire volume simultaneously with one of the excitation signals and means for exciting each planar section sequentially with the other excitation signal.

35. Apparatus as recited in claim 30 wherein the two excitation signals for each planar section are separated by the same time interval.

36. Apparatus as recited in claim 30 wherein the relaxation process is the spin-lattice relaxation time $T_1$ and the first excitation is an inversion excitation and the second excitation involves a flip angle of substantially 90°.

37. Apparatus as recited in claim 30 wherein the relaxation process is the spin-spin relaxation time $T_2$ and the first excitation involves a flip angle of substantially 90° and the second excitation is an inversion excitation.

* * * * *